United States Patent
Mae

(10) Patent No.: US 8,036,057 B2
(45) Date of Patent: Oct. 11, 2011

(54) SEMICONDUCTOR MEMORY DEVICE AND CONTROL METHOD THEREOF

(75) Inventor: Kenji Mae, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 172 days.

(21) Appl. No.: 12/385,959

(22) Filed: Apr. 24, 2009

(65) Prior Publication Data

US 2009/0268514 A1    Oct. 29, 2009

(30) Foreign Application Priority Data

Apr. 25, 2008  (JP) ................. 2008-115707

(51) Int. Cl.
*G11C 7/00* (2006.01)

(52) U.S. Cl. ............ 365/205; 365/163; 365/189.09; 365/230.06

(58) Field of Classification Search ........... 365/189.05, 365/189.15, 189.08, 230.06, 189.16, 148, 365/163, 295, 207

See application file for complete search history.

(56) References Cited

U.S. PATENT DOCUMENTS

| | | | |
|---|---|---|---|
| 7,153,504 B2 | 12/2006 | Follette et al. | |
| 7,154,788 B2 | 12/2006 | Takemura et al. | |
| 7,257,034 B2 | 8/2007 | Takemura et al. | |
| 7,304,885 B2 | 12/2007 | Cho et al. | |
| 2005/0068843 A1* | 3/2005 | Takeuchi | 365/233.5 |
| 2005/0237820 A1 | 10/2005 | Takemura et al. | |
| 2006/0007729 A1 | 1/2006 | Cho et al. | |
| 2007/0036777 A1 | 2/2007 | La Follette et al. | |
| 2007/0070716 A1 | 3/2007 | Takemura et al. | |
| 2008/0137402 A1 | 6/2008 | Cho et al. | |
| 2009/0067227 A1* | 3/2009 | Kang et al. | 365/163 |
| 2009/0097307 A1* | 4/2009 | Park et al. | 365/163 |

FOREIGN PATENT DOCUMENTS

| | | |
|---|---|---|
| JP | 5-303891 | 11/1993 |
| JP | 2005-158199 | 6/2005 |
| JP | 2006-24355 | 1/2006 |
| JP | 2006-31795 | 2/2006 |
| JP | 2006-294181 | 10/2006 |
| WO | WO 2006/014927 A1 | 2/2006 |

* cited by examiner

*Primary Examiner* — Richard Elms
*Assistant Examiner* — Hien Nguyen
(74) *Attorney, Agent, or Firm* — McGinn IP Law Group, PLLC

(57) ABSTRACT

A semiconductor memory device (and control method therefor) includes a plurality of word lines, a plurality of bit lines, a plurality of memory cells arranged at intersections of the word lines and the bit lines, a word driver that selects any one of the word lines, a plurality of sense amplifiers connectable to any of the bit lines, a sense-amplifier starting circuit that sequentially starts the sense amplifiers in response to a request of consecutive read operations to the memory cells connected to a predetermined word line, in a state that the predetermined word line is selected by the word driver, and an address determining circuit that temporarily stops an operation of the sense-amplifier starting circuit in response to a request of consecutive read operations to a same memory cell connected to a predetermined word line, in a state that the predetermined word line is selected by the word driver.

10 Claims, 11 Drawing Sheets

SEMICONDUCTOR MEMORY DEVICE AND CONTROL METHOD THEREOF

BACKGROUND OF THE INVENTION

1. Field of the Invention

The present invention relates to a semiconductor memory device and a control method thereof, and particularly relates to a semiconductor memory device including a plurality of sense amplifiers that can be connected to any of a plurality of bit lines and a control method thereof.

2. Description of Related Art

Currently, there are various types of semiconductor memory devices, and DRAM (Dynamic Random Access Memory) can be mentioned as a representative thereof. Most of DRAMs are of a synchronous type in which data is inputted and outputted in synchronization with a clock signal, and can be randomly accessed with a cycle of about 7 ns.

However, DRAM is a volatile memory, and therefore there are problems as follows. Stored data is lost once the power supply is disconnected, and thus DRAM is not suitable for storing a program or archival data that should be saved for a long period of time. Further, even when the power supply is being inputted, a periodic refreshing operation needs to be performed to maintain the data, and thus there is a limit to lowering of power consumption and also complicated control by a controller is necessary.

A flash memory is well-known as a large-capacity non-volatile semiconductor memory. However, even in the flash memory, there are disadvantages such that a large current is necessary for writing or deleting data, and also it requires a very long time for writing and erasing data. Therefore, it is not appropriate to use flash memory as an alternative to DRAM as a main memory. In addition, non-volatile memories such as MRAM (Magnetoresistive Random Access Memory) and FRAM (Ferroelectric Random Access Memory) have been proposed; however, these memories have a difficulty in obtaining the memory capacity equivalent to that of DRAM.

Meanwhile, as a semiconductor memory to be an alternative to DRAM, PRAM (Phase Change Random Access Memory) that performs recording using a phase change material has been proposed (see Japanese Patent Application Laid-open Nos. 2006-24355, 2005-158199, 2006-31795, and 2006-294181). In the PRAM, data is stored by a phase state of the phase change material included in a recording layer. That is, in the phase change material, an electric resistance in a crystal phase and that in an amorphous phase differ vastly, and the data can be recorded by utilizing this characteristic.

To change the phase state, the phase change material is heated by a writing current that is applied to the phase change material. On the other hand, to read the data, a resistance value is measured after sending a reading current to the phase change material. The reading current is set to a value that is sufficiently smaller than the writing current so that no phase change occurs. Due to this, unlike DRAM, PRAM can perform a non-destructive reading operation. Further, the phase state of the phase change material does not change unless high heat is applied, and thus, even when the power supply is disconnected, the data is not lost.

DRAM is a semiconductor memory device of a voltage sensing type, and thus a potential difference occurring in a bit line pair is amplified by a sense amplifier to read the data. In contrast thereto, PRAM is a semiconductor memory device of a current sensing type, and thus, to read the data, it is necessary to convert a retained content to a potential difference by sending a reading current to a memory cell, and also to amplify this potential difference.

Therefore, in the sense amplifier of PRAM, the circuit scale is much larger than that of the sense amplifier of DRAM. Accordingly, it is not practical to arrange the sense amplifier for each bit line like DRAM, and this requires sharing the same sense amplifier for a plurality of bit lines.

However, when the same sense amplifier is shared for the plural bit lines, if consecutive read operations are requested, it requires starting a next sensing operation after the completion of the current sensing operation. As a result, a data reading cycle is restricted by an operation speed of the sense amplifier. Hence, it has a problem that the data reading cycle becomes much longer as compared to that of the DRAM, which in turn cannot keep the compatibility with the DRAM.

Such a problem similarly occurs not only in PRAM but also in semiconductor memory devices of other types (for example, RRAM: Resistive Random Access Memory), in which a sensing operation takes a long period of time.

SUMMARY

The present invention seeks to solve one or more of the above problems, or to improve upon those problems at least in part.

In one embodiment, there is provided a semiconductor memory device that includes: a plurality of word lines; a plurality of bit lines; plurality of memory cells arranged at intersections of the word lines and the bit lines; a word driver that selects any one of the word lines; a plurality of sense amplifiers connectable to any of the bit lines; a sense-amplifier starting circuit that alternately starts the sense amplifiers in response to a request of consecutive read operations to different memory cells connected to a predetermined word line, in a state that the predetermined word line is selected by the word driver; and an address determining circuit that temporarily stops an operation of the sense-amplifier starting circuit in response to a request of consecutive read operations to a same memory cell connected to a predetermined word line, in a state that the predetermined word line is selected by the word driver.

In one embodiment, there is provided a control method of a semiconductor memory device including a plurality of word lines, a plurality of bit lines, a plurality of memory cells arranged at intersections of the word lines and the bit lines, a word driver that selects any one of the word lines, and a plurality of sense amplifiers connectable to any of the bit lines, the control method comprising: alternately starting the sense amplifiers in response to a request of consecutive read operations to different memory cells connected to a predetermined word line, in a state that the predetermined word line is selected by the word driver; and temporarily stopping starting of the sense amplifier in response to a request of consecutive read operations to a same memory cell connected to a predetermined word line, in a state that the predetermined word line is selected by the word driver.

According to the present invention, a plurality of sense amplifiers, which can be connected to any of a plurality of bit lines, are provided, and thus it becomes possible to execute a read operation for a plurality of memory cells connected to the same word line in parallel. Accordingly, even when the sensing operation takes a long period of time, the data reading can be performed at high speed by a parallel operation.

Furthermore, when the read operation is consecutively requested to the same memory cell, starting of the sense amplifier is stopped temporarily by an address determining circuit, and thus the sense amplifiers are not operated for the same memory cell in parallel. Accordingly, it becomes possible to avoid a data destruction occurring as a result of the sense amplifiers being operated for the same memory cell in parallel.

As a result, a high-speed read operation can be performed on an arbitrary address, and thus, even when the present invention is targeted for a PRAM, for example, the compatibility with a DRAM can be secured.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
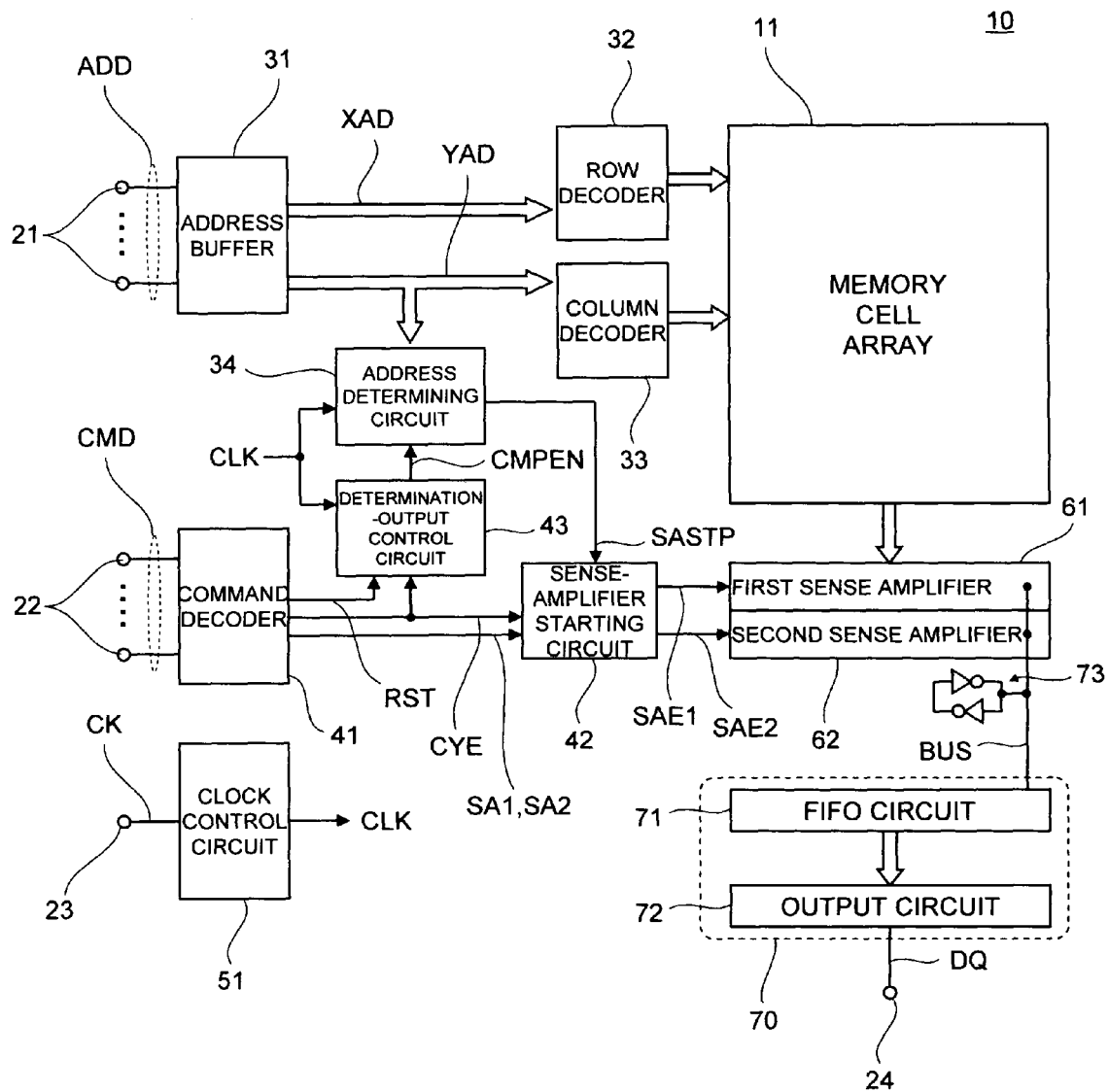
FIG. 1 is a block diagram showing a configuration of a semiconductor memory device according to a preferred embodiment of the present invention.

FIG. 1 is a block diagram showing a configuration of a semiconductor memory device according to a preferred embodiment of the present invention.

As shown in FIG. 1, a semiconductor memory device 10 according to the present embodiment includes a memory cell array 11 including a plurality of memory cells MC, a plurality of address terminals 21 that receive an address signal ADD, a plurality of command terminals 22 that receive a command signal CMD, a clock terminal 23 that receives an external clock signal CK, and a data terminal 24 that inputs and outputs data DQ. Although not particularly limited, the semiconductor memory device 10 is of a synchronous type which operates in synchronization with the external clock signal CK.

The address signal ADD inputted via the address terminals 21 is supplied to an address buffer 31. Among the address signal ADD supplied to the address buffer 31, a row address XAD is supplied to a row decoder 32 and a column address YAD is supplied to a column decoder 33 and an address determining circuit 34. The memory cell array 11 and the address determining circuit 34 will be described in detail later.

The row decoder 32 decodes the row address XAD and supplies the decoding result to a word driver (WD) within the memory cell array 11. Thereby, any one of a plurality of word lines included in the memory cell array 11 is selected.

The column decoder 33 decodes the column address YAD and supplies the decoding result to a column switch (YSW) within the memory cell array 11. As a result, any one of a plurality of column switches becomes conductive.

The command signal CMD inputted via the command terminals 22 is supplied to a command decoder 41. The command decoder 41 generates various internal commands by analyzing the command signal CMD. Although the command decoder 41 generates various internal commands, only a read enable signal CYE, a reset signal RST, and sense-amplifier selection signals SA1 and SA2 are shown in FIG. 1. Because other internal commands are not directly relevant to the gist of the present invention, explanations thereof will be omitted.

The read enable signal CYE is supplied to a sense-amplifier starting circuit 42 and a determination-output control circuit 43. Further, the reset signal RST is supplied to the determination-output control circuit 43, and the sense-amplifier selection signals SA1 and SA2 are supplied to the sense-amplifier starting circuit 42. The sense-amplifier starting circuit 42 and the determination-output control circuit 43 will be described in detail later.

The external clock signal CK inputted via the clock terminal 23 is supplied to a clock control circuit 51. The clock control circuit 51 generates various internal clocks based on the external clock signal CK. Although the clock control circuit 51 generates various internal clocks, note that only a latch clock CLK is shown in FIG. 1. Because other internal clocks are not directly relevant to the gist of the present invention, explanations thereof will be omitted. The latch clock CLK is supplied to the address determining circuit 34 and the determination-output control circuit 43.

Data read from the memory cell array 11 is amplified by a first sense amplifier 61 and a second sense amplifier 62. The sense amplifiers 61 and 62 are activated by sense amplifier start signals SAE1 and SAE2, respectively. The sense amplifier start signals SAE1 and SAE2 are supplied by the sense-amplifier starting circuit 42. Although the details are described below, these sense amplifiers 61 and 62 can be operated mutually in parallel, and accordingly, a reading cycle can be shortened.

Output of the sense amplifiers 61 and 62 are supplied to an output control circuit 70 via a data bus BUS. The output control circuit 70 includes a FIFO circuit 71 and an output circuit 72, and outputs read data DQ supplied via the data bus BUS from the data terminal 24. The read data DQ is outputted in synchronization with the external clock signal CK. Further, a latch circuit 73 is provided on the data bus BUS. Using this, as long as read data outputted from the sense amplifiers 61 and 62 are not changed, data on the data bus BUS maintains the immediately previous state.

Further, only one data terminal 24 is written in FIG. 1; however, the present invention is not limited thereto, and there can be a plurality of (for example, 16) data terminals 24 depending upon specifications. For example, when 16 data terminals 24 are arranged, 16 sets of circuit groups composed of the sense amplifiers 61 and 62, the data bus BUS, and the output control circuit 70 can be arranged. Thereby, 16-bit read data can be outputted at a time.

Figure 2:
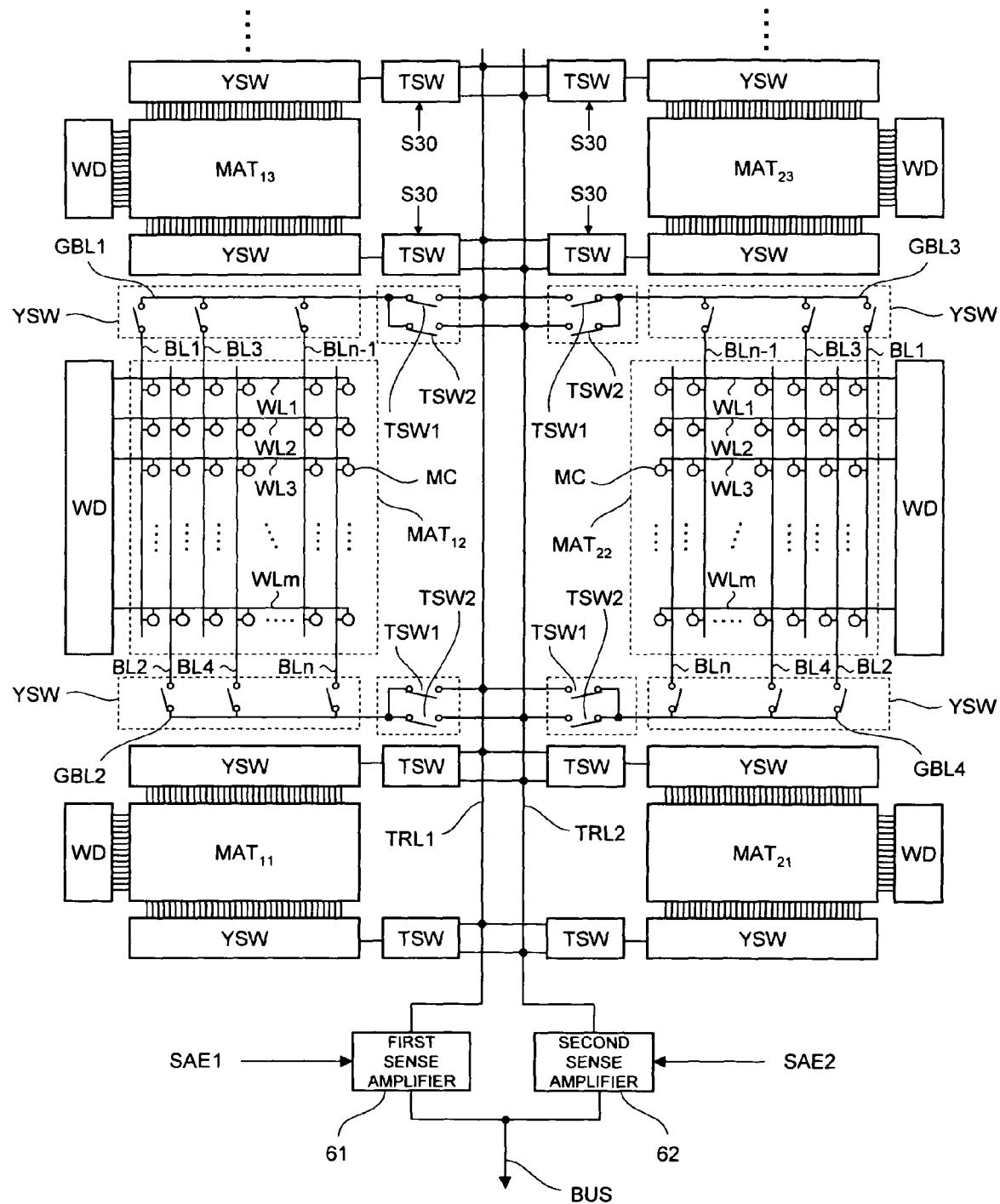
FIG. 2 is a circuit diagram for explaining a configuration of the memory cell array 11 in more detail.

FIG. 2 is a circuit diagram for explaining a configuration of the memory cell array 11 in more detail.

As shown in FIG. 2, the memory cell array 11 includes a plurality of memory mats $MAT_{11}$, $MAT_{12}$, $MAT_{13}$, . . . , and first and second transfer lines TRL1 and TRL2 allocated commonly to these memory mats MATs. The transfer lines TRL1 and TRL2 are connected to the first and second sense amplifiers 61 and 62, respectively.

The memory mats $MAT_{11}$, $MAT_{12}$, $MAT_{13}$, ..., are all configured by: a plurality of word lines WL1 to WLm; a plurality of bit lines BL1 to BLn; and the memory cells MC each arranged at the intersections. The word lines WL1 to WLm are selected by the word driver WD, and any one of the word lines WL1 to WLm is set to an activated state. The operation of the word driver WD is controlled by the row decoder 32, as described above. Further, the bit lines BL1 to BLn are configured such that these can be connected to a global bit lines GBL via the corresponding column switch YSW. The operation of the column switch YSW is controlled by the column decoder 33, as described above.

In the present embodiment, for each memory mat, two global bit lines GBL are arranged. More precisely, to the odd-numbered bit lines BL1, BL3, ..., BLn-1, one global bit line GBL1 (or GBL3) is allocated, and to even-numbered bit lines BL2, BL4, ..., BLn, the other global bit line GBL2 (or GBL4) is allocated. According to such a configuration, the read operation via the even-numbered bit lines can be executed in parallel during the read operation via the odd-numbered bit lines. Needless to say, this operation can be executed vice versa.

However, during the read operation via the odd-numbered bit line (for example, BL1), the read operation via the other odd-numbered bit line (for example, BL3) cannot be executed in parallel. Likewise, during the read operation via the even-numbered bit line (for example, BL2), the read operation via the other even-numbered bit line (for example, BL4) cannot be executed in parallel. The reason for this is that when such a bit-line selection is performed, data collision occurs on the same global bit line. However, when it is configured such that which bit line is to be selected out of the odd-numbered or even-numbered bit lines is determined by the row address, the even-numbered or odd-numbered bit lines cannot be selected consecutively.

Although not particularly limited, in the present embodiment, the same row address is allocated to the two memory mats MATs adjacent in a row direction, out of the memory mats MATs that share the transfer lines TRL1 and TRL2. For example, the word driver WD corresponding to memory mats $MAT_{12}$ and $MAT_{22}$ is supplied with the same row address. Thus, the word line included in the memory mat $MAT_{12}$ and the word line included in the memory mat $MAT_{22}$ can be selected simultaneously. Therefore, the word lines selected simultaneously can be short-circuited in advance.

According to such a configuration, four bit lines can be consecutively selected using the four global bit lines GBL1 to GBL4. In other words, the read operation via the four bit lines can be executed consecutively in a state that the row address is finalized and a predetermined word line is selected. The present invention is not limited thereto, and it is also possible to configure such that 8-bit or 16-bit consecutive access is enabled, for example.

Figure 3:
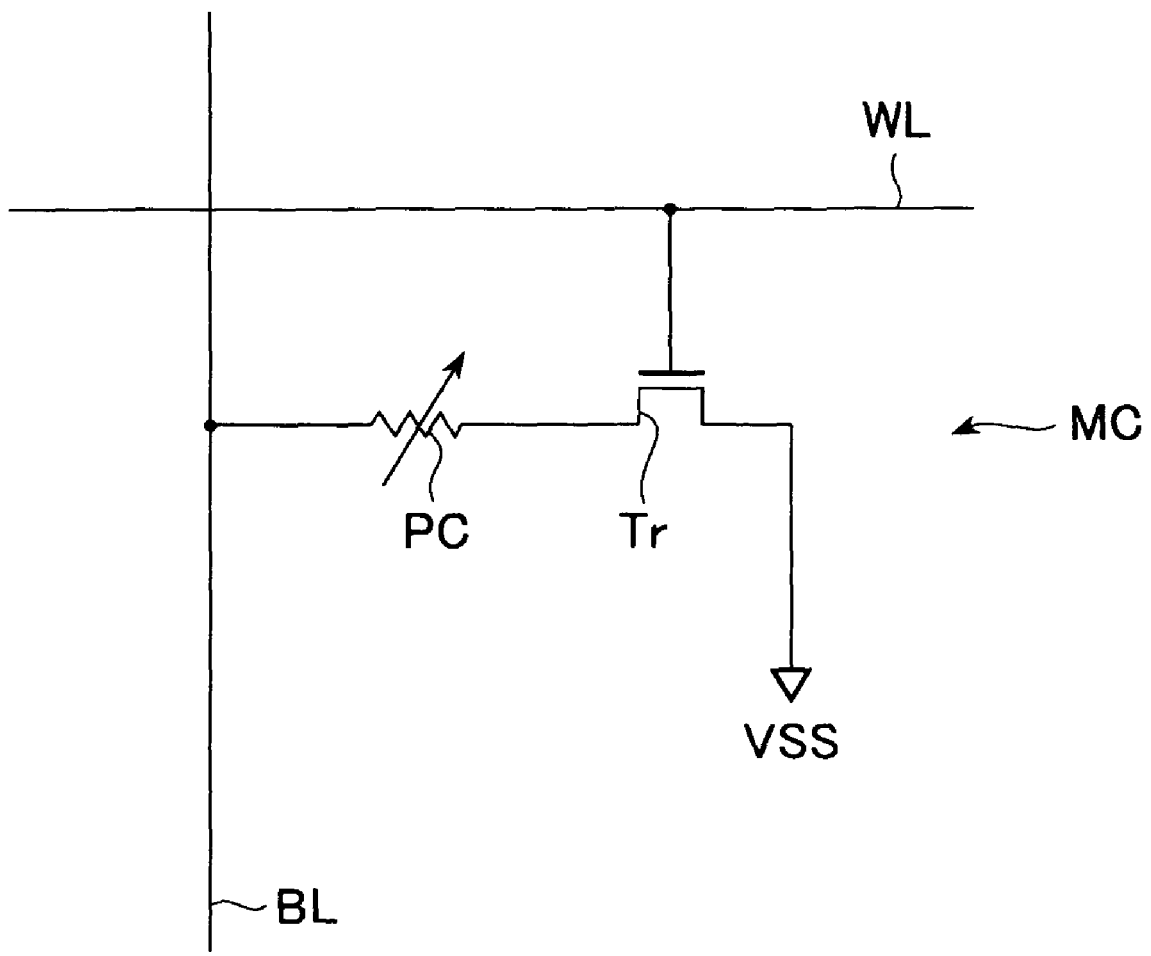
FIG. 3 is a circuit diagram of the memory cell MC.

FIG. 3 is a circuit diagram of the memory cell MC.

As shown in FIG. 3, the memory cell MC is configured by a selection transistor Tr and a phase-change memory device PC made of a phase change material, and these are connected in series between the bit line BL and the source line VSS.

For the phase change material configuring the phase-change memory device PC, any material is not particularly limited as long as it has two or more phase states and differs in electrical resistance depending on each phase state. However, it is preferable to select a so-called chalcogenide material. The chalcogenide material represents an alloy containing at least one or more elements selected from the group consisting of germanium (Ge), antimony (Sb), tellurium (Te), indium (In), selenium (Se) or the like. The examples thereof include binary elements such as GaSb, InSb, InSe, $Sb_2Te_3$, GeTe; ternary elements such as $Ge_2Sb_2Te_5$, InSbTe, GaSeTe, $SnSb_2Te_4$, InSbGe; and quaternary elements such as AgInSbTe, (GeSn)SbTe, GeSb(SeTe), $Te_{81}Ge_{15}Sb_2S_2$.

The phase change material containing the chalcogenide material can take either one of an amorphous phase (noncrystalline phase) and a crystalline phase. The chalcogenide material is in a relatively high resistance state in the amorphous phase, and is in a relatively low resistance state in the crystalline phase.

The selection transistor Tr is configured by an N-channel MOS transistor, and its gate electrode is connected to the corresponding word line WL. Accordingly, when the word line WL is activated, the phase-change memory device PC is connected to between the bit line BL and the source line VSS.

To amorphasize (reset) the phase change material, the phase change material is heated by applying thereto a writing current to a temperature equal to a melting point or above, and is then cooled rapidly thereafter. On the other hand, to crystalize (set) the phase change material, the phase change material is heated by applying thereto a writing current to a temperature equal to or above a crystalization temperature and less than the melting point, and thereafter, the temperature is gradually cooled. The application of such a writing current is supplied by a writing circuit (not shown). Note that a data writing operation is not directly relevant to the present invention, and thus explanations thereof will be omitted.

On the other hand, the data reading is performed as follows: the phase-change memory device PC is connected to the bit line BL by turning on the selection transistor Tr, and in this state, the reading current is passed. The reading current is set to a value that is sufficiently smaller than the writing current so that no phase change occurs. Thus, unlike DRAMs, non-destructive reading is possible in the memory cell MC. Further, the phase state of the phase change material does not change unless high heat is applied, and thus, even when the power supply is disconnected, the data is not lost. Circuits and operations related to the data reading will be described in detail below.

Referring back to FIG. 2, the transfer switch TSW is configured by: a first transfer switch TSW1 connected to a first transfer line TRL1; and a second transfer switch TSW2 connected to a second transfer line TRL2. These transfer switches TSW1 and TSW2 are exclusively turned on in response to a transfer signal S30. Accordingly, the selected memory cell MC is connected to the first sense amplifier 61 when the first transfer switch TSW1 is turned on and is connected to the second sense amplifier 62 when the second transfer switch TSW2 is turned on.

The transfer lines TRL1 and TRL2 are allocated commonly to the memory mats $MAT_{11}$, $MAT_{12}$, $MAT_{13}$, ..., as described above. Accordingly, the first and second sense amplifiers 61 and 62 are allocated commonly to the memory mats $MAT_{11}$, $MAT_{12}$, $MAT_{13}$, .... That is, there are arranged two systems of reading circuits for the memory mats $MAT_{11}$, $MAT_{12}$, $MAT_{13}$, ....

In general semiconductor memory devices like a DRAM, the sense amplifier is allocated to each bit line pair, and thus the sense amplifier is often located inside the cell array. However, when data is read in a PRAM, it is necessary to convert a retained content of the memory cell MC to a potential difference by sending a reading current in the phase-change memory device PC, further, to amplify this potential difference. Thus, in the sense amplifier of the PRAM, the circuit scale is much larger than that of the sense amplifier of a DRAM. From these reasons, in the present embodiment, the sense amplifiers 61 and 62 are commonly allocated to the memory mats $MAT_{11}$, $MAT_{12}$, $MAT_{13}$, . . . .

Figure 4:
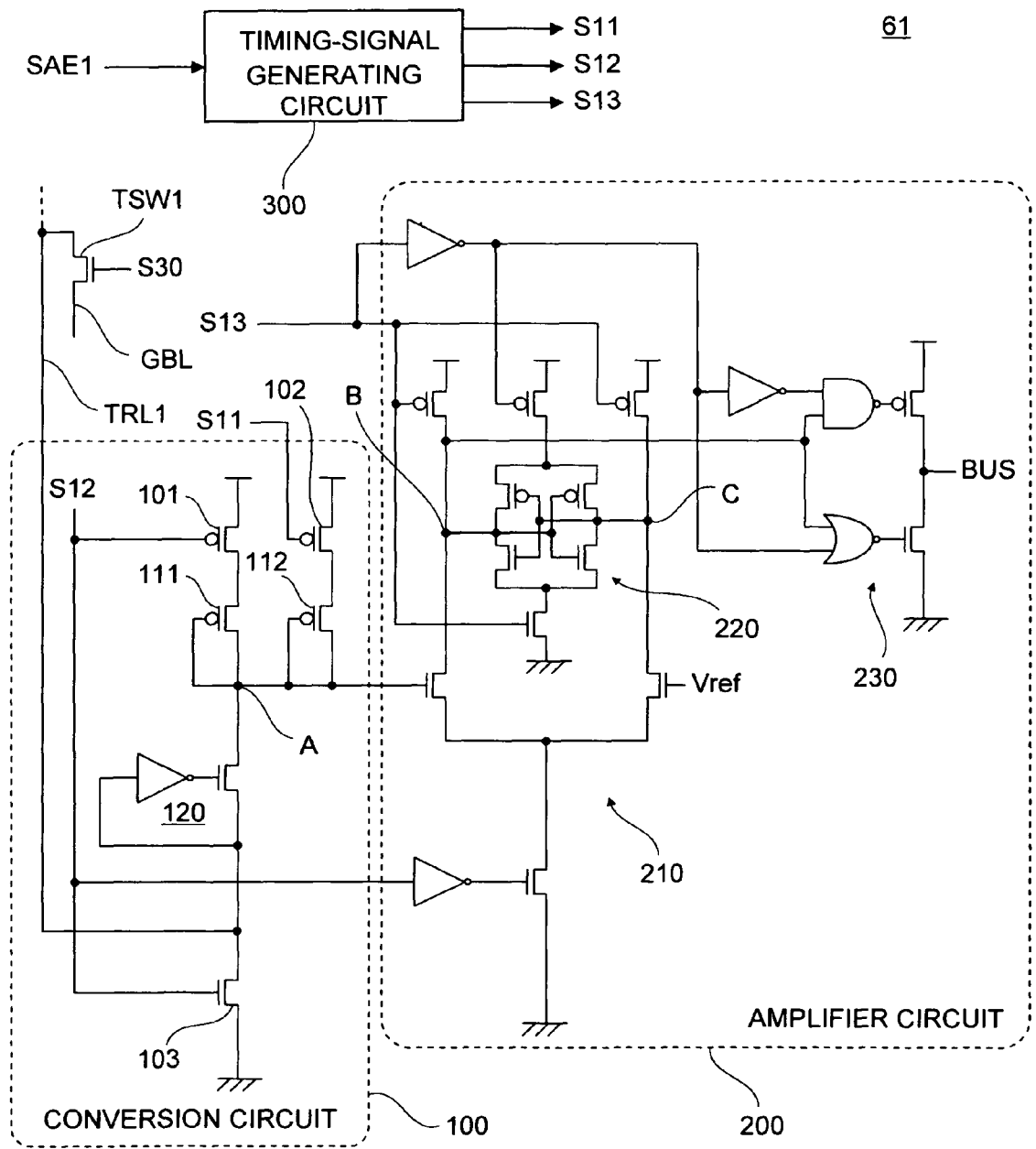
FIG. 4 is a circuit diagram of the first sense amplifier 61.

FIG. 4 is a circuit diagram of the first sense amplifier 61.

As shown in FIG. 4, the first sense amplifier 61 is configured by a conversion circuit 100, an amplifier circuit 200, and a timing-signal generating circuit 300. The conversion circuit 100 converts the retained content of the memory cell MC to a potential difference, the amplifier circuit 200 amplifies a potential difference generated in the conversion circuit 100. Further, the timing-signal generating circuit 300 generates a precharge signal S11, a sense activating signal S12, and a latch signal S13, and in response to the activation of the sense amplifier start signal SAE1 supplied from the sense-amplifier starting circuit 42, generates these signals S11 to S13.

As shown in FIG. 4, the conversion circuit 100 includes a reading transistor 101 and a precharge transistor 102 connected in parallel between the internal node A and a power supply wiring, and a reset transistor 103 connected between the internal node A and a ground wiring.

The reading transistor 101 is a P-channel MOS transistor and serves to supply a reading current to the transfer line TRL1 via diode-connected transistor 111 and current limiting circuit 120. The precharge transistor 102 is also a P-channel MOS transistor and serves to precharge the transfer line TRL1 via diode-connected transistor 112 and current limiting circuit 120. The reason for this is that the transfer line TRL1 is lowered to a ground level in a period before reading, and thus the potential needs to be increased quickly up to a readable level. Accordingly, a current supply capability of the precharge transistor 102 is designed sufficiently higher than that of the reading transistor 101.

Further, the reset transistor 103 is an N-channel MOS transistor and serves to lower the transfer line TRL1 to the ground level after the reading is completed.

The precharge signal S11 is supplied to the gate of the precharge transistor 102. Thus, when the precharge signal S11 reaches an active level (low level), the transfer line TRL1 is precharged promptly. Further, the sense activating signal S12 is supplied commonly to the gates of the reading transistor 101 and the reset transistor 103. Thus, when the sense activating signal S12 reaches an active level (low level), the reading current is supplied to the transfer line TRL1, and when at an inactive level (high level), the transfer line TRL1 is connected to the ground level.

On the other hand, the amplifier circuit 200 includes a differential circuit unit 210, a latch unit 220, and an output circuit 230.

The differential circuit unit 210 compares the potential of the internal node A and the reference potential Vref, executes a comparison operation when the sense activating signal S12 reaches an active level, and causes a larger potential difference to occur between internal nodes B and C. Further, the latch unit 220 maintains output of the differential circuit unit 210, and executes a latch operation when the latch signal S13 reaches an active level (high level). The output circuit 230 drives the data bus BUS based on the output of the differential circuit unit 210, and executes an output operation when the latch signal S13 reaches an active level.

The circuit configuration of the first sense amplifier 61 is as described above. The second sense amplifier 62 has the same circuit configuration as that of the first sense amplifier 61 shown in FIG. 4 except that the conversion circuit 100 is connected to the second transfer line TRL2 and the sense amplifier start signal SAE2 is supplied to the timing-signal generating circuit 300.

Figure 5:
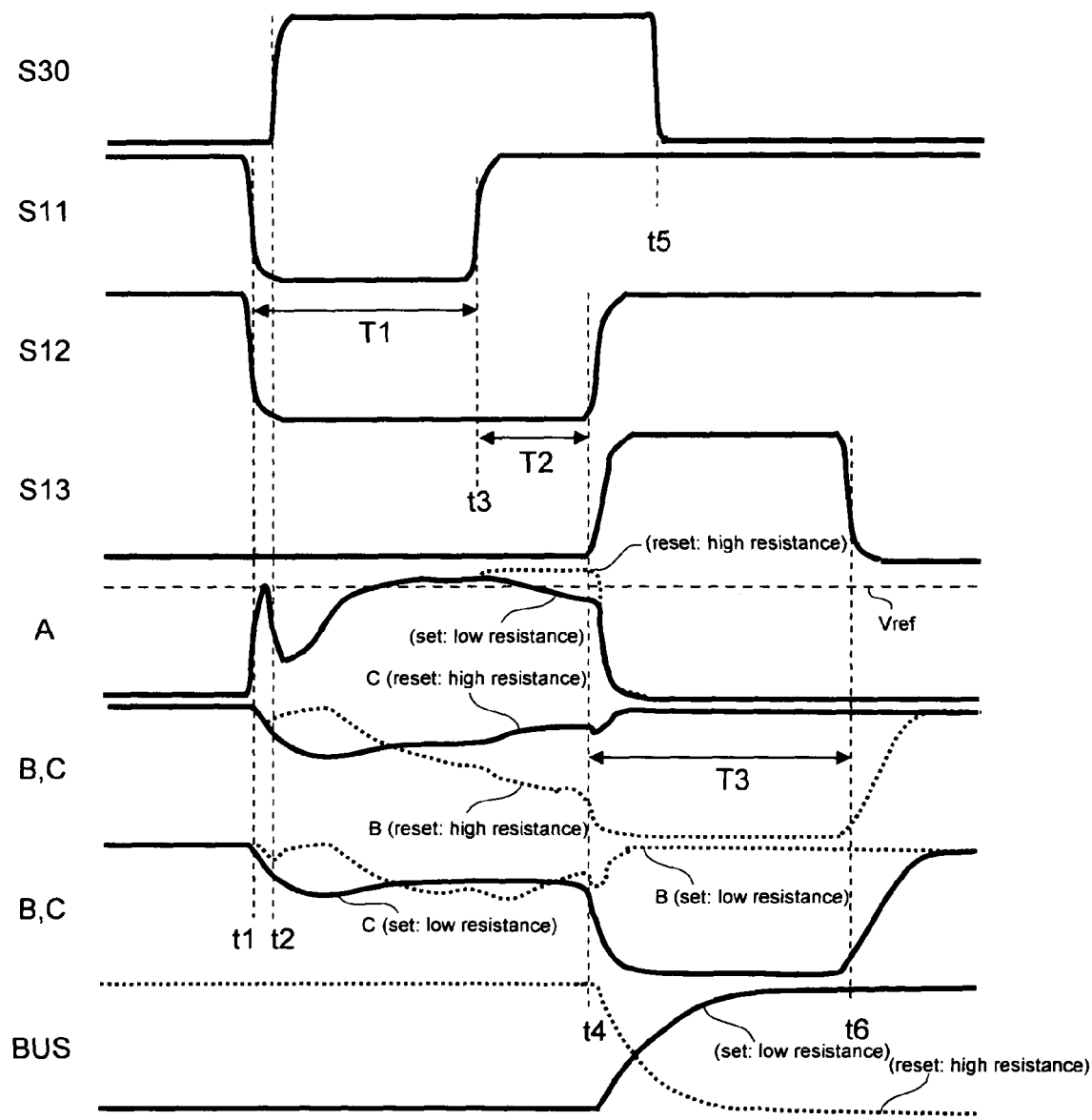
FIG. 5 is a timing chart for explaining the operation of the first sense amplifier 61.

FIG. 5 is a timing chart for explaining the operation of the first sense amplifier 61.

In a state before the data is read (before time t1) using the first sense amplifier SA1, both the precharge signal S11 and the sense activating signal S12 are at a high level. As a result, the reset transistor 103 is turned on, and thus the transfer line TRL1 is kept at the ground level.

At time t1, when the precharge signal S11 and sense activating signal S12 are activated at a low level, the reset transistor 103 is turned off and the reading transistor 101 and the precharge transistor 102 are turned on. Thus, the transfer line TRL1 is precharged. Accordingly, the potential of the internal node A is raised approximately up to the reference potential Vref.

Next, at time t2, a predetermined transfer signal S30 is activated. Thereby, the first transfer switch TSW1 that corresponds to the memory mat MAT to be read is turned on. As a result, the capacity of the transfer line TRL1 as viewed from the sense amplifier SA1 increases, and thus the potential of the internal node A is promptly lowered. However, the reading transistor 101 and the precharge transistor 102 have been turned on, and thus the precharge operation progresses and the potential of the internal node A is raised again approximately up to the reference potential Vref.

Next, at time t3 at which the precharge is completed, the precharge signal S11 is inactivated to a high level. The sense activating signal S12 is kept maintaining an activation state. Thereby, with respect to the current supplied to the transfer line TRL1, there is left only the reading current via the reading transistor 101.

Thus, when the memory cell MC to be read is in a high resistance state, i.e., when the phase-change memory device PC is in an amorphous state (reset state), the potential of the internal node A becomes higher than the reference potential Vref. On the contrary, when the memory cell MC to be read is in a low resistance state, i.e., when the phase-change memory device PC is in a crystalline state (set state), the potential of the internal node A becomes lower than the reference potential Vref.

Thus, according to the retained content of the memory cell MC, a predetermined potential difference occurs between the internal node A and the reference potential Vref. According thereto, the differential circuit unit 210 included in the amplifier circuit 200 causes a greater potential difference to occur in the internal nodes B and C.

Next, at time t4, the sense activating signal S12 is inactivated to a high level, and also, the latch signal S13 is activated to a high level. Thereby, the latch unit 220 included in the amplifier circuit 200 raises one of the internal nodes B and C up to the power supply potential, and lowers the other to the ground level. The latch unit 220 maintains this state. The maintained information is outputted to the data bus BUS via the output circuit 230.

After activating the latch unit 220 included in the amplifier circuit 200, the read data is maintained, and thus the connection between the memory cell MC and the sense amplifier SA1 is unnecessary. Accordingly, at time t5 immediately after time t4, the transfer signal S30 is inactivated.

After the reading of the data via the data bus BUS is completed, the latch signal S13 at time t6 is inactivated at a low level. Accordingly, the state of each signal is returned back to the state before time t1, and as a result, a subsequent reading operation using the same sense amplifier 61 can be started.

The operation of the sense amplifier 61 is as described above. In the present embodiment, two systems of such a sense amplifier are arranged, and thus these two sense amplifiers can be operated in parallel. The parallel operation of the sense amplifiers is described later.

Figure 6:
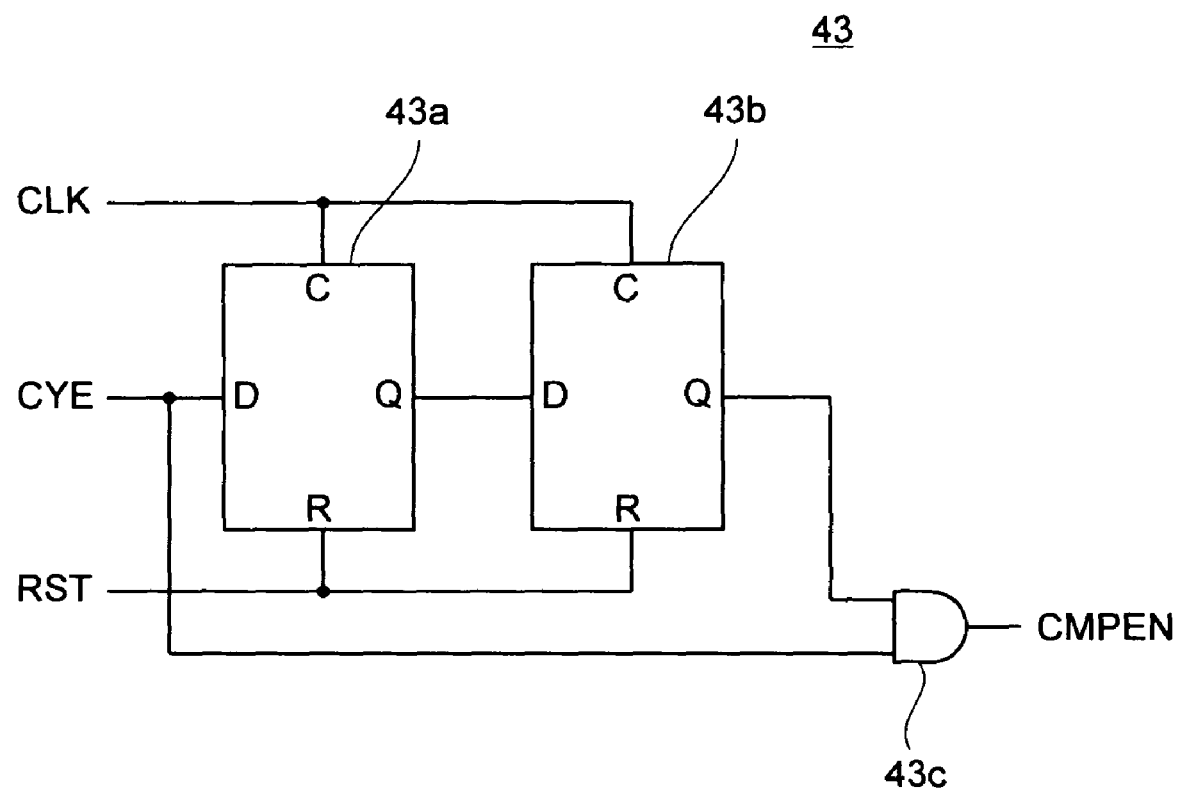
FIG. 6 is a circuit diagram of the determination-output control circuit 43.

FIG. 6 is a circuit diagram of the determination-output control circuit 43.

As shown in FIG. 6, the determination-output control circuit 43 is configured by: two latch circuits 43a and 43b connected in cascade; and an AND circuit 43c. The latch circuits 43a and 43b each include the input node D, the output node Q, the clock node C, and a reset node R, and latch a logical level of the input node D in synchronization with the latch clock CLK supplied to the clock node C. The latched logical level is outputted from the output node Q. Further, the reset signal RST is supplied to the reset node R, and when the reset signal RST is activated, latch contents of the latch circuits 43a and 43b are reset to a low level. The reset signal RST is activated when power supply is inputted and at a reset time.

The input node D of a latch circuit 43a at a preceding stage is supplied with the read enable signal CYE. Further, this output node Q is connected to the input node D of a latch circuit 43b at a subsequent stage. The AND circuit 43c generates a determination permitting signal CMPEN. One input node of the AND circuit 43c is supplied with the read enable signal CYE and the other thereof is supplied with output of the latch circuit 43b at the subsequent stage.

According to such a circuit configuration, the determination-output control circuit 43 activates the determination permitting signal CMPEN when the read enable signal CYE is generated two times consecutively in synchronization with the latch clock CLK. The determination permitting signal CMPEN generated by the determination-output control circuit 43 is supplied to the address determining circuit 34 shown in FIG. 1.

Figure 7:
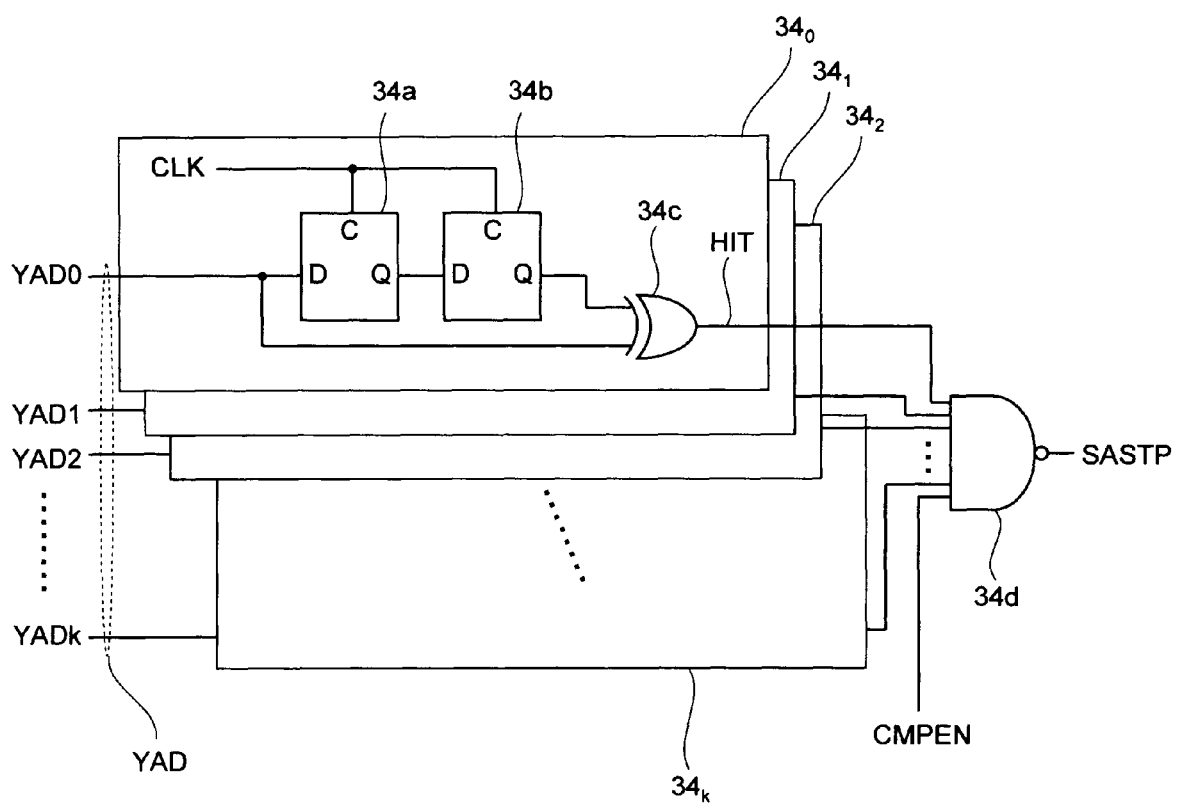
FIG. 7 is a circuit diagram of the address determining circuit 34.

FIG. 7 is a circuit diagram of the address determining circuit 34.

As shown in FIG. 7, the address determining circuit 34 is configured by: comparison circuits $34_0$ to $34_k$ equal in number to the number of bits (k+1 bits) of the column address YAD; and a NAND circuit 34d. The comparison circuits $34_0$ to $34_k$ are supplied with bits YAD0 to YADK each configuring the column address YAD, respectively.

The comparison circuits $34_0$ to $34_k$ have the same circuit configuration to one another, and configured by: two latch circuits 34a and 34b connected in cascade; and an EXNOR (Exclusive Not OR) circuit 34c, as shown in FIG. 7. The latch circuits 34a and 34b each have the input node D, the output node Q, and the clock node C, and latch a logical level of the input node D in synchronization with the latch clock CLK supplied to the clock node C. The latched logical level is outputted from the output node Q.

The input node D of the latch circuit 34a at a preceding stage is supplied with the corresponding bit of the column address YAD. Further, this output node Q is connected to the input node D of the latch circuit 34b at a subsequent stage. The EXNOR circuit 34c generates a match signal HIT. One input node of the EXNOR circuit 34c is supplied with the corresponding bit of the column address YAD and the other input node is supplied with output of the latch circuit 34b at the subsequent stage.

According to such a circuit configuration, each comparison circuit $34_0$ to $34_k$ activates the match signal HIT when the corresponding bit of the column address YAD is the same logical level two times consecutively. The match signal HIT from the comparison circuits $34_0$ to $34_k$ is all supplied to the NAND circuit 34d. Further, in the NAND circuit 34d, the determination permitting signal CMPEN generated by the determination-output control circuit 43 is inputted.

Thereby, the address determining circuit 34 activates a sense stop signal SASTP to a low level when conditions, under which the determination permitting signal CMPEN is activated and the value of the column addresses YAD is the same consecutively, are satisfied.

Examples of the case that such conditions are satisfied include: a case that when the row address XAD is fixed, the same column address YAD is designated, and a read command is issued consecutively (case 1); and a case that when the row address XAD is fixed, the same column address YAD as the last column address YAD of a burst operation is designated, and a read command is issued (case 2). At this time, the reason why "when the row address XAD is fixed" is the condition is that unless the consecutive read operations are performed when the row address XAD is fixed, the determination permitting signal CMPEN is not activated. Note that when the row address XAD is fixed, a state that a predetermined word line WD is kept being selected is maintained.

The sense stop signal SASTP thus generated is supplied to the sense-amplifier starting circuit 42 shown in FIG. 1.

Figure 8:
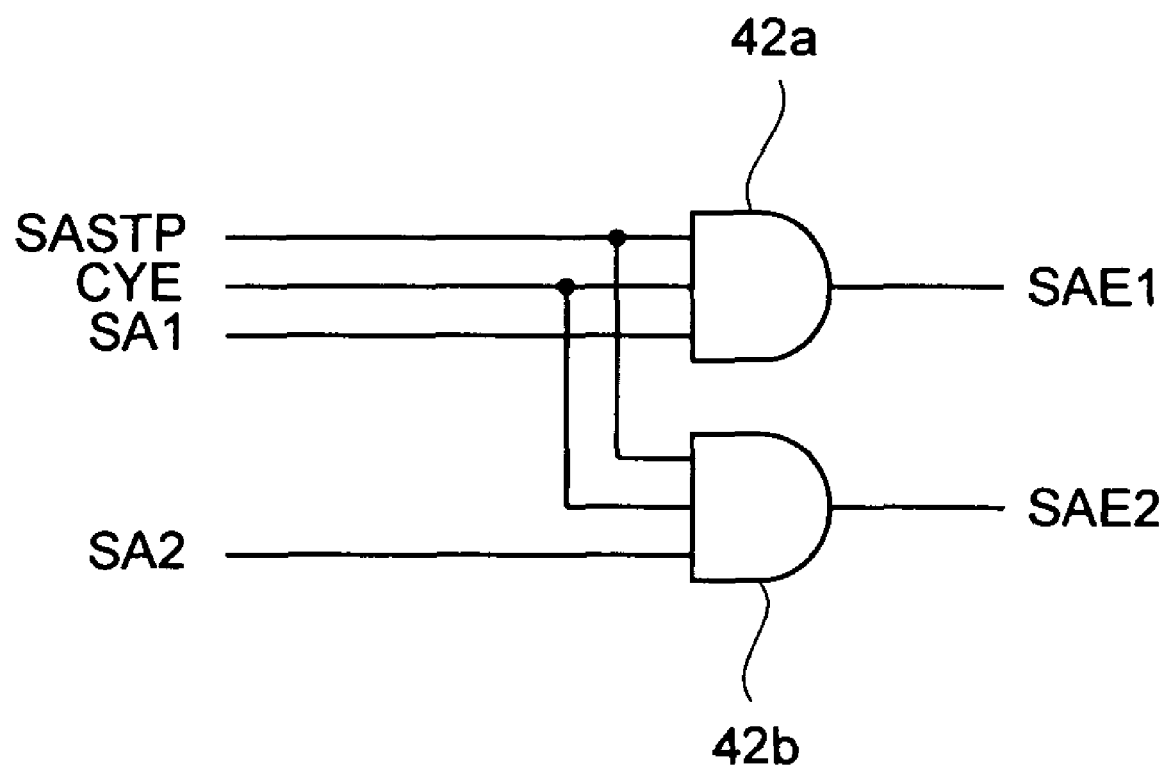
FIG. 8 is a circuit diagram of the sense-amplifier starting circuit 42.

FIG. 8 is a circuit diagram of the sense-amplifier starting circuit 42.

As shown in FIG. 8, the sense-amplifier starting circuit 42 is configured by two AND circuits 42a and 42b. The AND circuits 42a and 42b are supplied commonly with the sense stop signal SASTP and the read enable signal CYE, and individually supplied with the selection signals SA1 and SA2 of the sense amplifier. The selection signals SA1 and SA2 of the sense amplifier are signals for selecting which sense amplifiers, i.e., the sense amplifiers 61 and 62, are used during the read operation, and are activated alternatively at least during the consecutive read operations.

According to such a configuration, during the read operation, in synchronization with the read enable signal CYE, one of the sense amplifier start signals SAE1 and SAE2 is activated to a high level. However, when the sense stop signal SASTP is at a low level, the sense-amplifier selection signals SA1 and SA2 are masked, and the both sense amplifier start signals SAE1 and SAE2 are maintained at a low level. The conditions under which the sense stop signal SASTP is at a low level are as described above.

The configuration of the semiconductor memory device 10 is as described above. The operation of the semiconductor memory device 10 is described next.

Figure 9:
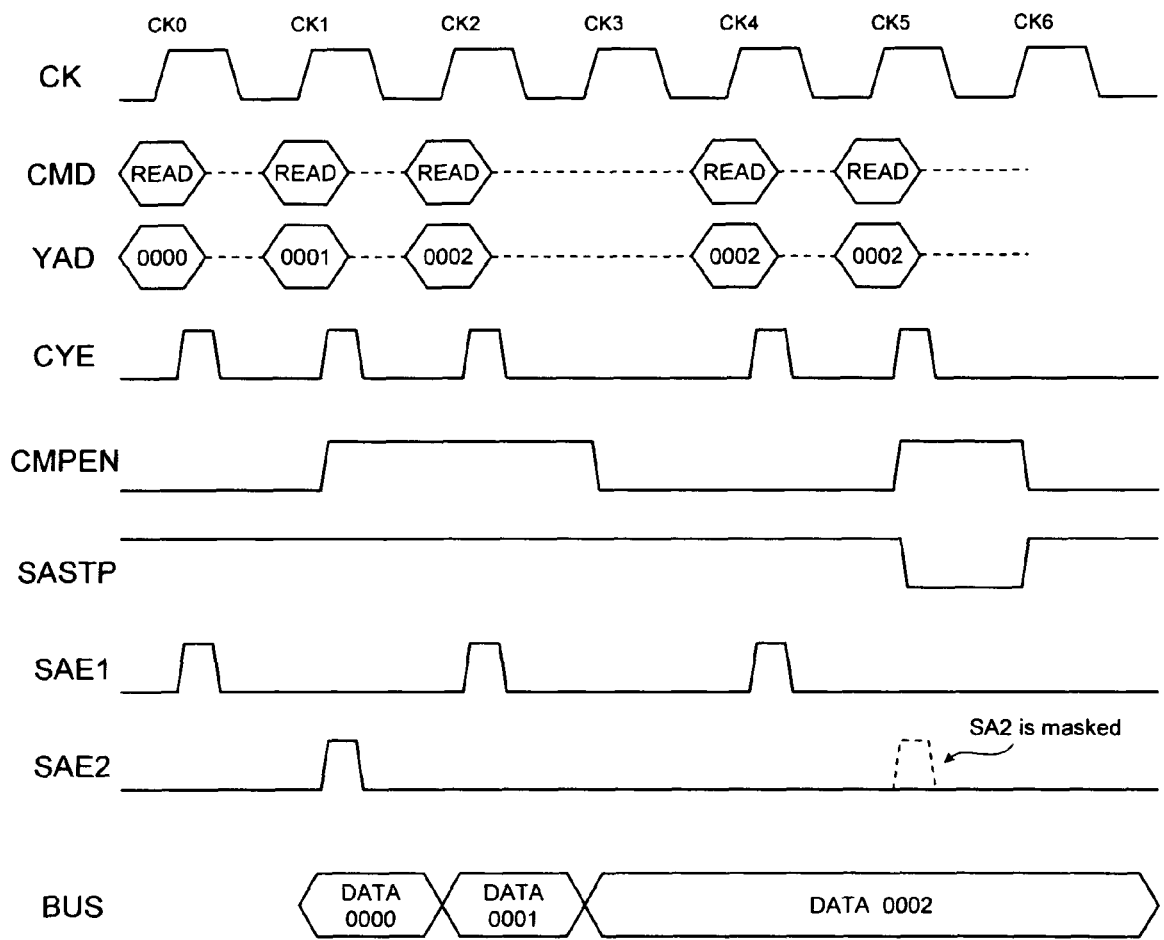
FIG. 9 is a timing chart for explaining the operation of the semiconductor memory device 10.

FIG. 9 is a timing chart for explaining the operation of the semiconductor memory device 10.

An example shown in FIG. 9 shows a case that a read command is issued in synchronization with active edges CK0, CK1, CK2, CK4, and CK5 of the external clock signal CK, and the respectively designated column addresses YAD have values shown in FIG. 9. Although not shown in FIG. 9, an active command is issued before the active edge CK0. Thereby, at least subsequent to the active edge CK0, the row address is finalized. That is, a state that a predetermined word line is selected is kept.

As shown in FIG. 9, when a READ command (READ) is issued, the read enable signal CYE is activated at each time. Further, the sense amplifier start signals SAE1 and SAE2 are activated alternately for the external clock signal CK or the read enable signal CYE. Thereby, the sense amplifiers 61 and 62 are selected alternately. For example, as shown in FIG. 9, when the sense amplifier start signals SAE1 and SAE2 are activated alternately for the external clock signal CK, the sense amplifier start signal SAE1 is activated for the read command in synchronization with the active edges CK0, CK2, and CK4. Thereby, the sense amplifier 61 is selected. For the read command synchronous with the active edge CK1, the sense amplifier start signal SAE2 is activated, and thereby, the sense amplifier 62 is selected. Contrary thereto, when the sense amplifier start signals SAE1 and SAE2 are activated alternately for the read enable signal CYE, for the read command synchronous with the active edges CK0 and CK2, the sense amplifier start signal SAE1 is activated, and for the read command synchronous with the active edges CK1 and CK4, the sense amplifier start signal SAE2 is activated. In FIG. 9, the example in which the sense amplifier start signals SAE1 and SAE2 are activated alternately for the clock signal CK is shown. However, the present invention is not limited thereto.

The read command synchronous with the active edges CK1, CK2, and CK5 falls under the second (or more) in the consecutive read command, and thus the determination permitting signal CMPEN is activated in response thereto. When the determination permitting signal CMPEN is activated, as described above, the determination operation by the address determining circuit 34 is in a permitted state.

However, in the read command synchronous with the active edge CK1, a column address YAD (0001) different from a column address YAD (0000) designated in the immediately proceeding (CK0) read operation is designated, and thus the sense stop signal SASTP is not activated and maintains the high level. Likewise, also in the read command synchronous with the active edge CK2, a column address YAD (0002) different from the column address YAD (0001) designated in the immediately proceeding (CK1) read operation is designated, and thus the sense stop signal SASTP is not activated and maintains the high level.

Thus, even when the read command is issued consecutively, if the designated column addresses YAD differ, the sense stop signal SASTP maintains the high level. Thus, the sense amplifier start signals SAE1 and SAE2 are activated alternately, and a parallel operation by the sense amplifiers 61 and 62 is executed. The parallel operation of the sense amplifiers 61 and 62 are described later.

Meanwhile, in the read command synchronous with the active edge CK4, the same column address YAD (0002) as the column address YAD (0002) designated in the read operation of last time (CK2) is designated. However, the read enable signal CYE synchronous with the immediately preceding timing (CK3) is not generated, and thus the determination permitting signal CMPEN is in an inactive state. As a result, the sense stop signal SASTP maintains the high level.

On the other hand, in the read command synchronous with the active edge CK5, the same column address YAD (0002) as the column address YAD (0002) designated in the immediately preceding (CK4) read operation is designated. Thus, the sense stop signal SASTP is activated to a low level. As a result, the selection signal (in this case, SA2) of the sense amplifier is masked, and the sense amplifier start signal SAE2 that should be activated originally is left at a low level. As a result, the sensing operation for the designated column address YAD (0002) is not performed.

However, in the present embodiment, the latch circuit 73 is arranged on the data bus and the immediately preceding read data is maintained, and thus the correct read data (DATA 0002) can be outputted without performing the sensing operation.

As described above, in the present embodiment, when a condition under which the two sense amplifiers 61 and 62 are operated in parallel for the same memory cell MC is generated, the operation of the sense amplifier (the sense amplifier 62 in the example shown in FIG. 9) selected later is stopped. Thus, the correct read data can be outputted while preventing the data destruction resulting from the parallel operation of a plurality of sense amplifiers for the same memory cell MC.

Japanese Patent Application Laid-open (JP-A) No. H5-303891 describes a semiconductor memory device configured such that when consecutive read operations are requested to the same address, read data of last time is outputted without accessing a memory cell. However, the semiconductor memory device described in JP-A No. H5-303891 is not configured such that a plurality of sense amplifiers can be connected to any one of a plurality of bit line. Accordingly, it is not possible to perform a high-speed operation, which is enabled by using a plurality of sense amplifiers in parallel. Further, the semiconductor memory device described in JP-A No. H5-303891 is not configured as the embodiment of the present invention described above, and thus the data destruction does not occur even when the read operations are consecutively performed on the same addresses. That is, the semiconductor memory device described in JP-A No. H5-303891 differs from the configuration as the precondition of the present invention.

Figure 10:
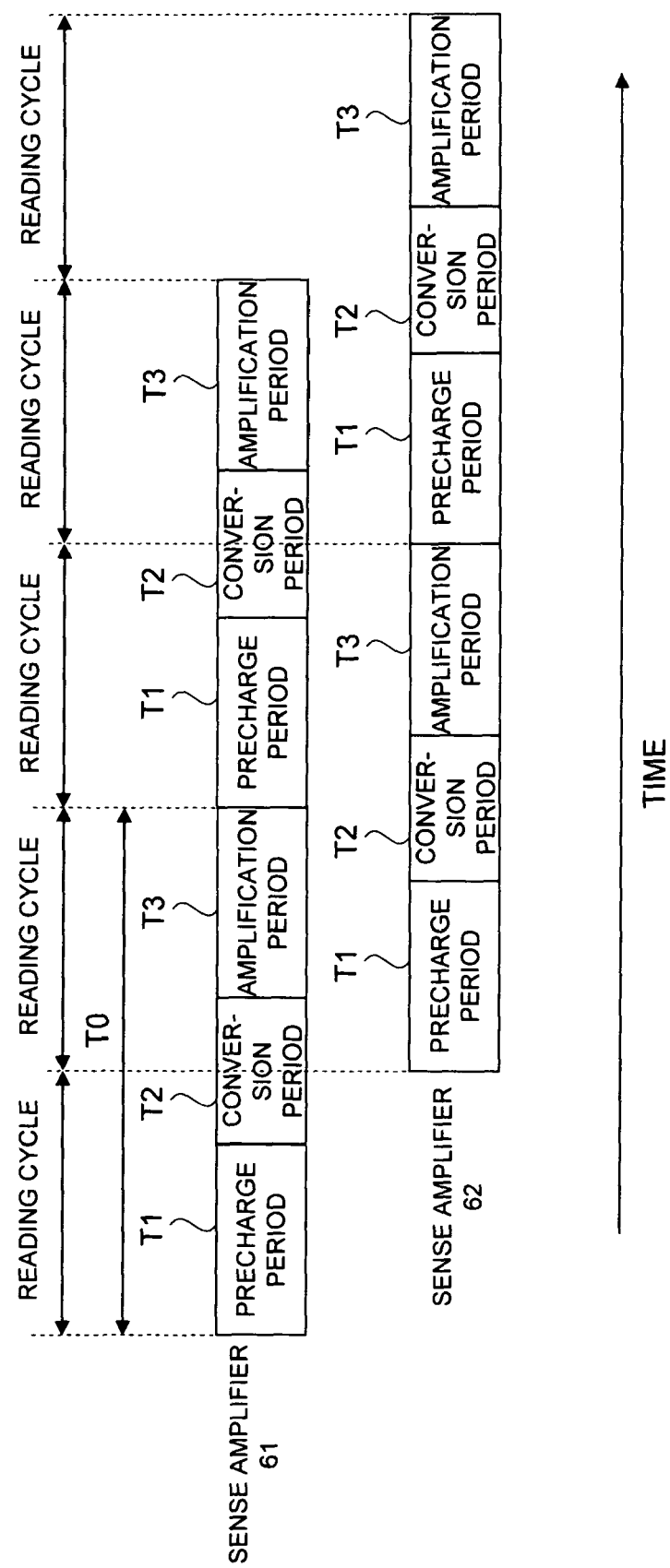
FIG. 10 is a schematic timing chart for explaining the parallel operation of the sense amplifiers 61 and 62.

FIG. 10 is a schematic timing chart for explaining the parallel operation of the sense amplifiers 61 and 62.

As shown in FIG. 10, operating periods T0 of the sense amplifiers 61 and 62 are both configured by a precharge period T1, a conversion period T2, and an amplification period T3.

The precharge period T1 is a period during which the potential of the transfer line TRL1 or that of the transfer line TRL2 is raised from the ground level up to the precharge level, and corresponds to a period from times t1 to t3 shown in FIG. 5. Accordingly, this operation is executed by the conversion circuit 100.

The conversion period T2 is a period during which the retained content of the memory cell MC is converted to the potential difference by sending the reading current to the memory cell MC via the transfer line TRL1 or the transfer line TRL2, and corresponds to the period during times t3 to t4 shown in FIG. 5. Accordingly, this operation is also executed by the conversion circuit 100.

The amplification period T3 is a period during which the potential difference between the potential of the internal node A and the reference potential Vref is amplified, and corresponds to the period during times t4 to t6 shown in FIG. 5. Accordingly, this operation is executed by the amplifier circuit 200.

Further, in the present embodiment, the sense amplifiers 61 and 62 can be operated in parallel, and thus the reading cycle is shortened to one half of the operation period T0. However, as shown in FIG. 10, in the present embodiment, the reading operation of the other sense amplifier is started before one sense amplifier enters the amplification period T3, and thus the bit line connected to the same global bit line GBL cannot be selected consecutively.

However, as described above, when the different row address is allocated to a plurality of bit lines connected to the same global bit line GBL, the bit line connected to the same global bit line GBL cannot be selected consecutively. In the example shown in FIG. 2, a total of four global bit lines GBL1 to GBL 4 are arranged in the two memory mats MATs (for example, the memory mats $MAT_{12}$ and $MAT_{22}$) allocated with the same row address, and thus 4-bit read operations can be consecutively enabled by switching the column addresses YAD.

It is apparent that the present invention is not limited to the above embodiments, but may be modified and changed without departing from the scope and spirit of the invention.

For example, in the present embodiment, an example in which the present invention is applied to a PRAM has been described. However, the present invention is not only targeted therefor, but also can be applied to other types of semiconductor memory devices. Accordingly, it poses no problem that, instead of the phase-change memory device PC included in the memory cell MC, other memory devices (for example, a variable resistance element used for the RRAM) can be used. It is not essential that the memory cell MC is non-volatile, and it can be volatile.

Further, although it is not essential that the memory cell MC is a variable resistance element, the memory cell MC using a variable resistance element takes a longer period of time for the sensing operation as compared to a DRAM cell or the like, and thus the present invention is very preferably applied to a semiconductor memory device using such a memory cell. The reason for this is that as described above, in such a type of semiconductor memory device, the circuit scale of the sense amplifier is very large, and thus the arrangement of a sense amplifier for each bit line (which is a case of a DRAM) is not practical.

Figure 11:
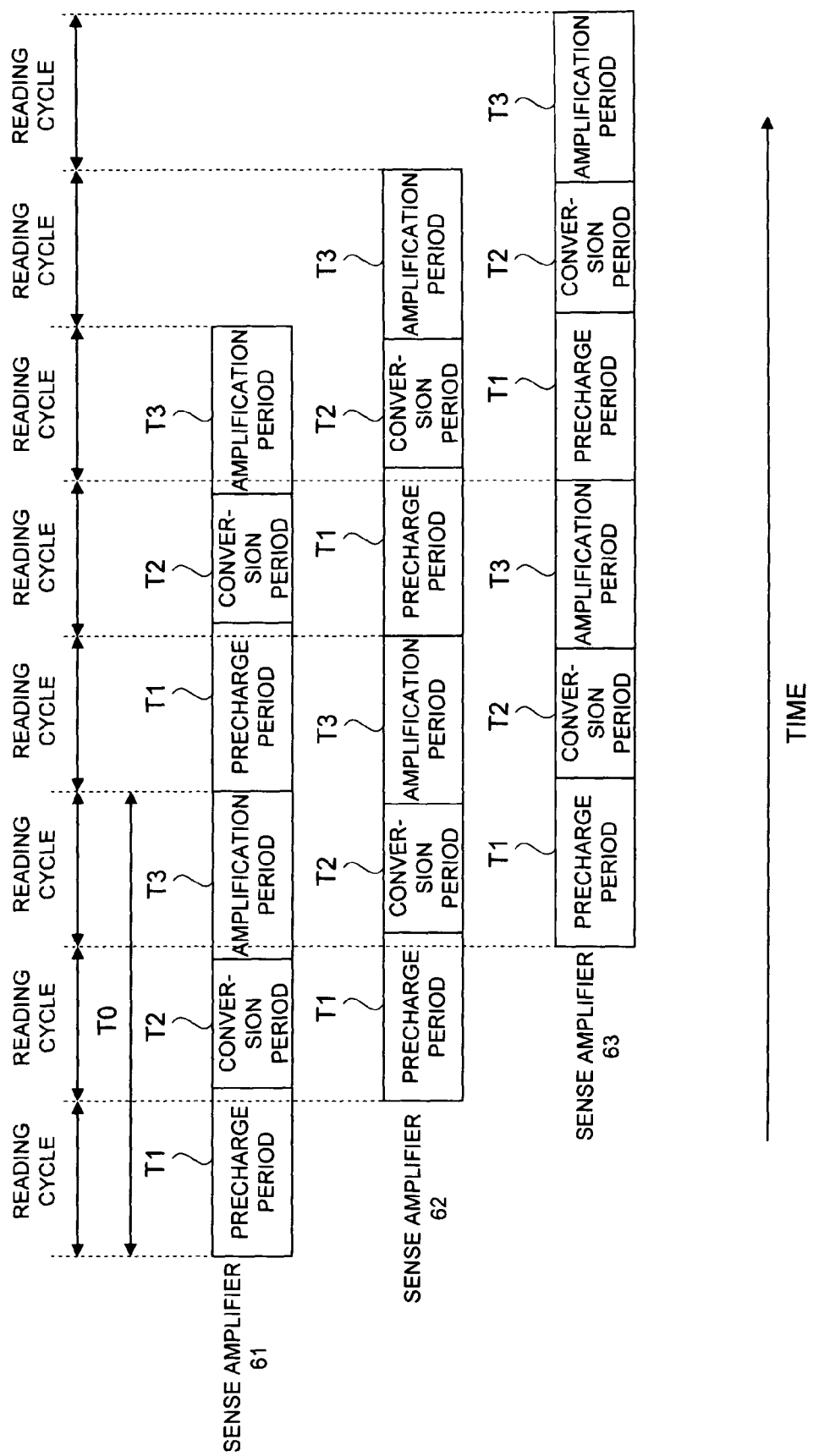
FIG. 11 is an explanatory diagram of the operation when three sense amplifiers 61 to 63 are used in parallel.

Further, in the present embodiment, the two sense amplifiers 61 and 62 are operated in parallel. However, three or more sense amplifiers can be also used in parallel. FIG. 11 is an explanatory diagram of the operation when three sense amplifiers 61 to 63 are used in parallel. As shown in FIG. 11, when three sense amplifiers 61 to 63 are used in parallel, the reading cycle can be shortened to one third of the operation period T0. Needless to say, when four or more sense amplifiers are used in parallel, the reading cycle can be further shortened.

What is claimed is:

1. A semiconductor memory device comprising:
   a plurality of word lines;
   a plurality of bit lines;
   a plurality of memory cells arranged at intersections of the word lines and the bit lines;
   a word driver that selects any one of the word lines;
   a plurality of sense amplifiers connectable to any of the bit lines;
   a sense-amplifier starting circuit that alternately starts the sense amplifiers in response to a request of consecutive read operations to different memory cells connected to a predetermined word line, in a state that the predetermined word line is selected by the word driver; and
   an address determining circuit that temporarily stops an operation of the sense-amplifier starting circuit in response to a request of consecutive read operations to a same memory cell connected to a predetermined word line, in a state that the predetermined word line is selected by the word driver.

2. The semiconductor memory device as claimed in claim 1, further comprising:
   an output control circuit that outputs read data to outside;
   a data bus that connects the sense amplifiers and the output control circuit; and
   a latch circuit that temporarily maintains the read data on the data bus.

3. The semiconductor memory device as claimed in claim 2, wherein the memory cell includes a variable resistance element in which a resistance value differs depending on stored information.

4. The semiconductor memory device as claimed in claim 3, wherein the variable resistance element includes a phase change material.

5. The semiconductor memory device as claimed in claim 1, further comprising:
   a plurality of global bit lines connected to mutually different plural bit lines; and
   a plurality of transfer lines each connectable to any of the global bit lines, wherein
   each sense amplifiers are connected to an associated one of the transfer lines.

6. The semiconductor memory device as claimed in claim 5, further comprising transfer switches that connect the different global bit lines to mutually different transfer lines in response to a request of consecutive accesses to the memory cells connected to the different global bit lines, in a state that a predetermined word line is selected by the word driver.

7. The semiconductor memory device as claimed in claim 6, wherein
   each of the sense amplifiers includes a conversion circuit that converts the stored information of each memory cell into a potential difference, and
   the sense-amplifier starting circuit starts a conversion operation by the conversion circuit of another sense amplifier different from a predetermined sense amplifier, during execution of the conversion operation by the conversion circuit of the predetermined sense amplifier, in response to the request of consecutive accesses to the memory cells connected to the predetermined word line.

8. A control method of a semiconductor memory device including a plurality of word lines, a plurality of bit lines, a plurality of memory cells arranged at intersections of the word lines and the bit lines, a word driver that selects any one of the word lines, and a plurality of sense amplifiers connectable to any of the bit lines, the control method comprising:
   alternately starting the sense amplifiers in response to a request of consecutive read operations to different memory cells connected to a predetermined word line, in a state that the predetermined word line is selected by the word driver; and
   temporarily stopping starting of the sense amplifier in response to a request of consecutive read operations to a same memory cell connected to a predetermined word line, in a state that the predetermined word line is selected by the word driver.

9. The control method of a semiconductor memory device as claimed in claim 8, wherein read data read immediately before is outputted in response to a request of consecutive read operations to the same memory cell connected to a predetermined word line, in a state that the predetermined word line is selected by the word driver.

10. The control method of a semiconductor memory device as claimed in claim 8, wherein
    the sense amplifiers include first and second sense amplifiers having a conversion circuit that converts stored information of each of the memory cells to a potential difference, and
    a conversion operation using the conversion circuit of the first sense amplifier and a conversion operation using the conversion circuit of the second sense amplifier are executed in parallel.

* * * * *